(12) United States Patent
Higuchi et al.

(10) Patent No.: US 8,815,737 B2
(45) Date of Patent: Aug. 26, 2014

(54) METHOD FOR FORMING NISI FILM, METHOD FOR FORMING SILICIDE FILM, METHOD FOR FORMING METAL FILM FOR USE IN SILICIDE-ANNEALING, APPARATUS FOR VACUUM PROCESSING AND FILM-FORMING APPARATUS

(75) Inventors: Yasushi Higuchi, Shizuoka (JP); Toshimitsu Uehigashi, Shizuoka (JP); Kazuhiro Sonoda, Shizuoka (JP); Harunori Ushikawa, Shizuoka (JP); Naoki Hanada, Shizuoka (JP)

(73) Assignee: Ulvac, Inc., Kanagawa (JP)

( * ) Notice: Subject to any disclaimer, the term of this patent is extended or adjusted under 35 U.S.C. 154(b) by 0 days.

(21) Appl. No.: 13/423,946

(22) Filed: Mar. 19, 2012

(65) Prior Publication Data
US 2012/0244701 A1 Sep. 27, 2012

(30) Foreign Application Priority Data

Mar. 25, 2011 (JP) ................................. 2011-068514

(51) Int. Cl.
*H01L 21/44* (2006.01)
*H01L 21/285* (2006.01)
*C23C 16/18* (2006.01)
*C23C 16/56* (2006.01)
*H01L 29/45* (2006.01)

(52) U.S. Cl.
CPC .... *H01L 21/28518* (2013.01); *H01L 21/28556* (2013.01); *C23C 16/18* (2013.01); *C23C 16/56* (2013.01); *H01L 29/456* (2013.01)
USPC ........... 438/664; 438/653; 438/629; 438/680; 438/655; 257/369

(58) Field of Classification Search
USPC ........... 438/664, 653, 629, 680, 655; 257/369
See application file for complete search history.

(56) References Cited

U.S. PATENT DOCUMENTS

| 7,981,794 | B2 * | 7/2011 | Narushima et al. | 438/653 |
| 7,994,049 | B2 * | 8/2011 | Futase | 438/629 |
| 2009/0325372 | A1 | 12/2009 | Harada | |
| 2010/0084713 | A1 * | 4/2010 | Nakagawa et al. | 257/369 |
| 2010/0304561 | A1 * | 12/2010 | Narushima et al. | 438/653 |
| 2011/0086509 | A1 * | 4/2011 | Ganguli et al. | 438/655 |
| 2011/0104896 | A1 * | 5/2011 | Harada et al. | 438/680 |
| 2012/0214303 | A1 * | 8/2012 | Ganguli et al. | 438/664 |

FOREIGN PATENT DOCUMENTS

| JP | 2001-203211 A | 7/2001 |
| JP | 2003-328130 A | 11/2003 |
| KR | 10-2003-0073818 A | 9/2003 |

OTHER PUBLICATIONS

Korean Office Action dated Jun. 16, 2013, 5 pages.

* cited by examiner

*Primary Examiner* — Fernando L Toledo
*Assistant Examiner* — Mohammed Shamsuzzaman
(74) *Attorney, Agent, or Firm* — Arent Fox LLP

(57) ABSTRACT

The method for the formation of a silicide film herein provided comprises the steps of forming an Ni film on the surface of a substrate mainly composed of Si and then heat-treating the resulting Ni film to thus form an NiSi film as an upper layer of the substrate, wherein, prior to the heat-treatment for the formation of the NiSi film, the Ni film is subjected to a preannealing treatment using $H_2$ gas at a temperature which is less than the heat-treatment temperature and which never causes the formation of any NiSi film in order to remove any impurity present in the Ni film, and the resulting Ni film is then subjected to a silicide-annealing treatment to thus form the NiSi film.

7 Claims, 9 Drawing Sheets

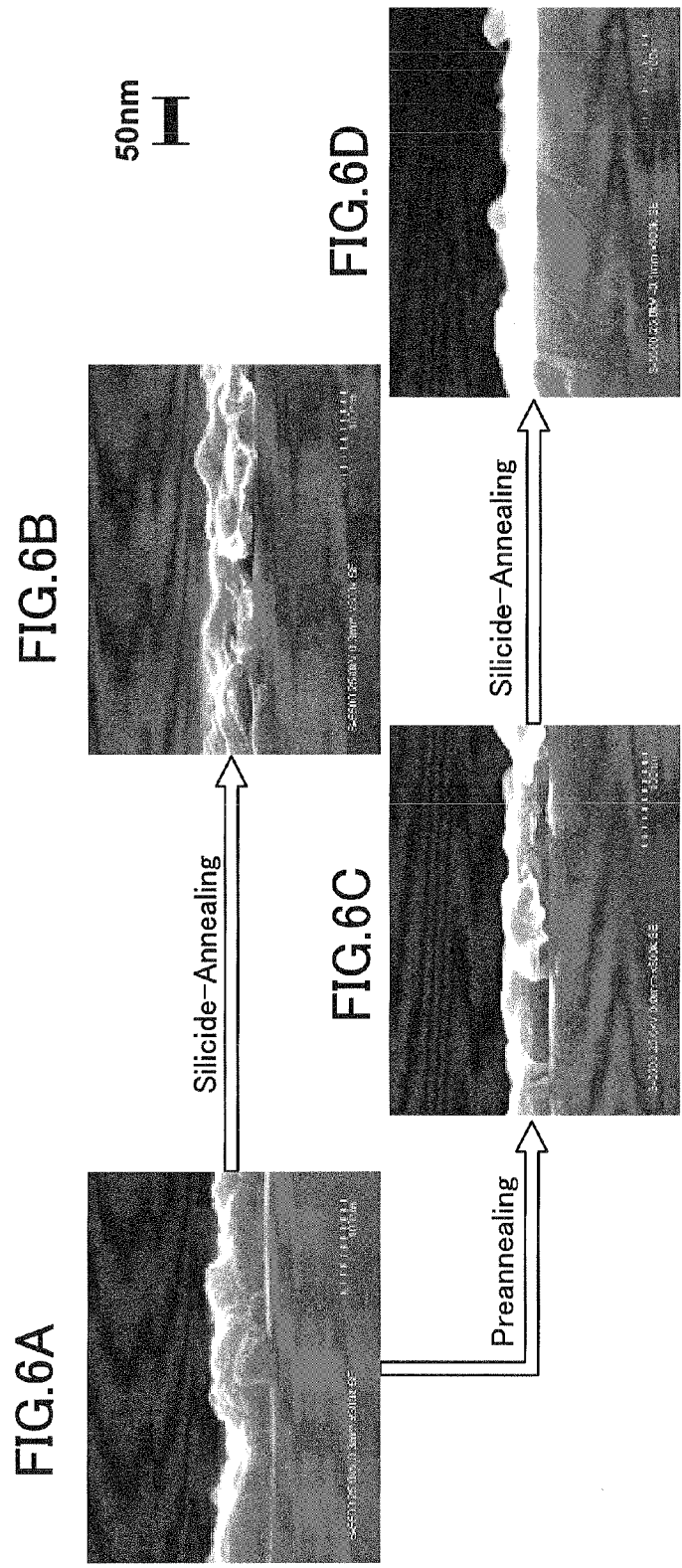

Silicide-Annealing →

△

H₂-Preannealing →

→

○

Ar-Preannealing →

→

✕

NH₃-Preannealing →

→

✕

As Deposited Film 39 ohm/sq
FIG.10A-1      FIG.10A-2
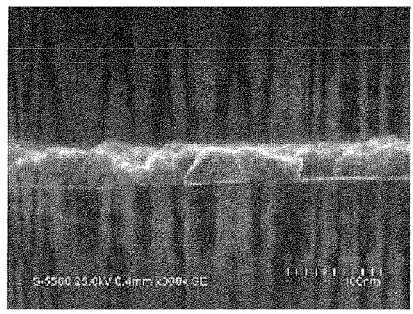 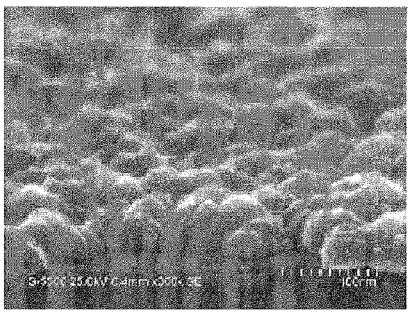
As Deposited/Silicide-Annealed
Film 10.9 ohm/sq
FIG.10B-1      FIG.10B-2
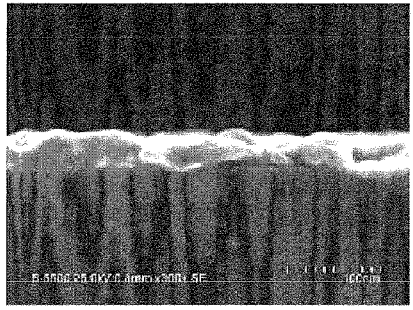 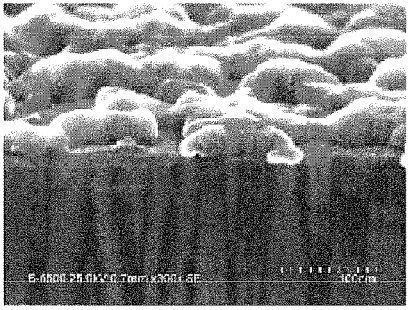
As Deposited/$H_2$-Preannealed
Film 8.8 ohm/sq
FIG.10C-1      FIG.10C-2
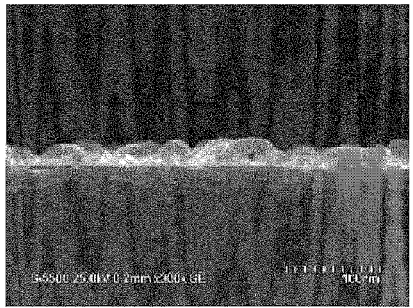 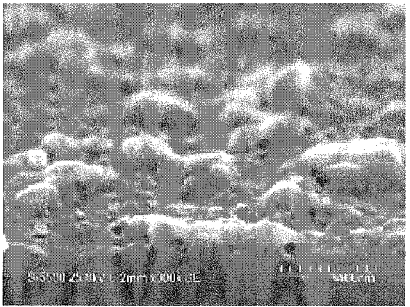
As Deposited/$H_2$- Preannealed/
Silicide-Annealed Film 3.1 ohm/sq
FIG.10D-1      FIG.10D-2
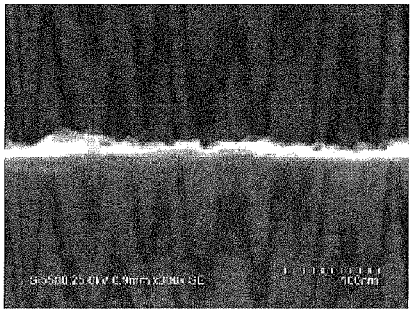 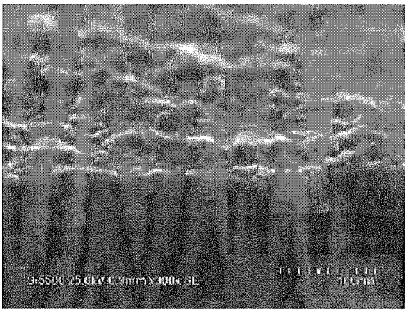

METHOD FOR FORMING NISI FILM, METHOD FOR FORMING SILICIDE FILM, METHOD FOR FORMING METAL FILM FOR USE IN SILICIDE-ANNEALING, APPARATUS FOR VACUUM PROCESSING AND FILM-FORMING APPARATUS

TECHNICAL FIELD

The present invention relates to a method for forming an NiSi film, a method for forming a silicide film, a method for forming a metal film for use in silicide-annealing, an apparatus for vacuum processing and a film-forming apparatus.

BACKGROUND ART

As the techniques for the miniaturization of semiconductor devices have recently been advanced and as the semiconductor devices have increasingly been manufactured so as to have three-dimensional structures, it has increasingly been needed to form a silicide film on the bottom and/or side walls of trench and hole patterns, which have been formed on a substrate and there has also been an increasing demand for the development of a technique which can ensure the achievement of high coverage characteristics (the step coverage) with respect to these bottom and/or side walls of the trench and hole patterns.

As a metallic material used for forming such a silicide film, there have in general been used, for instance, Ti, Co and Ni. In this respect, the sputtering technique has conventionally been used for the deposition of films of these metals, but this technique has been found to be insufficient in the coverage characteristics of such films used for covering the bottom and/or side walls of the trench and hole patterns with the recent progress of the miniaturization technology and accordingly, it would be difficult for this technique to cope with the foregoing situations.

For this reason, there has been developed a CVD technique in which a film is formed while a metal compound is introduced into a film-forming system after the compound is converted into its gaseous state. Nevertheless, this CVD technique suffers from a variety of problems as will be described below, since an organometal compound is used as a metal-containing gaseous precursor in this CVD technique: A large quantity of impurities such as C, N and O are incorporated into the resulting film; even if subjecting the film to a heat treatment for the conversion thereof into a silicide, the silicide-forming reaction is inhibited by the action of these impurities; and it is thus quite difficult to form a silicide film from the metal film prepared according to this CVD technique as compared with the metal film prepared according to the conventional sputtering technique.

In this respect, a silicide film can be formed simply by the film-forming step according to the CVD technique at a high temperature (for instance, 500° C.) which permits the direct preparation of a silicide film, but it would be quite difficult for this CVD technique to form an excellent silicide interface required for the semiconductor device or the like. For instance, a problem arises such that. in the case of Ni, the NiSi film can form a good interface having a low resistance, but an $NiSi_2$ film is formed when the film-forming step is carried out at a high temperature and any flat interface having a low resistance cannot be formed. In addition, in such a film-forming step at a high temperature, further problems arise such that although the film-forming rate is increased, the rate may be limited to undesirable level since the flow rate of the precursor serves as a rate-determining step and the coverage characteristics of the film are deteriorated.

Moreover, when a semiconductor device is manufactured, a hydrogen-annealing treatment has been carried out (see, for instance, Patent Document 1 specified below) for the purposes of, for instance, the removal of the oxygen present in a conductive metal film, the removal of the impurities present in a conductive metal film (such as a Cu film) to thus improve the electrical characteristics of the metal film, and the improvement of the adhesion of the primary film to a Cu film.

PRIOR ART LITERATURE

Patent Literature

Patent Document 1: Japanese Un-Examined Patent Publication No. 2001-203211.

SUMMARY OF THE INVENTION

Problems that the Invention is to Solve

It is an object of the present invention to solve the problems associated with the foregoing conventional techniques and more specifically to provide a method for forming an NiSi film, which can form a silicide film having excellent coverage characteristics of the film used for covering the bottom and/or side walls of trench and hole patterns formed on a substrate and having a low resistance (resistivity) in order to ensure low resistant electric contact with a metal film in respect of a substrate mainly composed of Si or a gate electrode; a method for forming a silicide film; a method for the formation of a metal film for use in a silicide-annealing treatment, an apparatus for vacuum processing and a film-forming apparatus.

Means for the Solution of the Problems

The inventors of this invention have found out that the concentration of impurities present in a metal film prepared according to the thermal CVD technique can be reduced by subjecting the metal film to a heat treatment in an $H_2$ gas atmosphere and that an excellent silicide film can be formed, after the heat-treatment, by subjecting the heat-treated metal film to a silicide film-forming reaction and the inventors have further found out that it is effective to use a film-forming apparatus which permits the heat-treatment of a metal film, after the formation thereof, according to the through processing in vacuo in order to efficiently carry out this silicide film-forming method and have thus completed the present invention.

The method for the formation of an NiSi film according to the present invention comprises the steps of forming an Ni film on the surface of a substrate mainly composed of Si and then heat-treating the resulting Ni film to thus form an NiSi film as an upper layer of the substrate, wherein, prior to the heat-treatment for the formation of the desired NiSi film, the Ni film is subjected to a preannealing treatment using $H_2$ gas at a temperature which is less than the heat-treatment temperature and which never causes the formation of any NiSi film, in order to remove any impurity present in the Ni film, and wherein the resulting Ni film is then subjected to a silicide-annealing treatment to thus form the desired NiSi film.

The foregoing method for the formation of an NiSi film is further characterized in that a nickel alkylamidinate is used as a precursor for forming the Ni film and the Ni film is formed according to the thermal CVD technique.

The method for the formation of a silicide film having a low resistance according to the present invention comprises the steps of forming a metal film on the surface of a substrate mainly composed of Si and then heat-treating the resulting metal film to thus form a silicide film as an upper layer of the substrate, wherein, prior to the heat-treatment for the formation of the silicide film, the metal film is subjected to a preannealing treatment using $H_2$ gas at a temperature which is less than the heat-treatment temperature and which never causes the formation of any low resistant silicide film in order to remove any impurity present in the metal film, and wherein the resulting metal film is then subjected to a silicide-annealing treatment to thus form a desired silicide film.

The foregoing method for the formation of the low resistant silicide film is further characterized in that a nickel alkylamidinate or a cobalt alkylamidinate is used as a precursor for forming the metal film and the metal film is formed according to the thermal CVD technique.

The method for the formation of a metal film for use in the silicide annealing treatment according to the present invention comprises the steps of forming a metal film on the surface of a substrate mainly composed of Si according to the thermal CVD technique and then subjecting the resulting metal film to a preannealing treatment using $H_2$ gas to thus remove nitrogen as an impurity present in the metal film and originated from the precursor used for forming the same.

The foregoing method for the formation of the metal film for use in the silicide annealing treatment is further characterized in that the metal film is an Ni film or a Co film.

The foregoing method for the formation of the metal film for use in the silicide annealing treatment is further characterized in that a nickel alkylamidinate or a cobalt alkylamidinate is used as a precursor for forming the metal film.

The foregoing method for the formation of the metal film for use in the silicide annealing treatment is further characterized in that the preannealing treatment using $H_2$ gas is carried out at a temperature ranging from 300 to 400° C.

A first apparatus for vacuum processing used in the formation of an Ni film to be converted into a silicide film on the surface of a substrate mainly composed of Si, according to the present invention, comprises a film-forming chamber equipped with an exhaust system; a substrate-supporting stage equipped with a heating means and positioned at the lower portion of the film-forming chamber; a shower plate located above the substrate-supporting stage; a gas-introduction path for the introduction of a reducing gas into the film-forming chamber and a gas-introduction path for the introduction, into the film-forming chamber, a raw gas for forming an Ni film consisting of a nickel alkylamidinate gas, these two gas-introduction paths being connected to the film-forming chamber; a canister for accommodating a precursor arranged in the course of the gas-introduction path for the introduction of the Ni film-forming raw gas; and a gas-introduction path for introducing an inert gas, which is used in gasifying a liquefied precursor through the bubbling thereof and introducing the gasified precursor into the film-forming chamber and which is connected to the canister of the precursor, wherein the film-forming chamber is provided with a gas-supply path for supplying $H_2$ gas for use in a preannealing treatment, which is carried out for the improvement of the quality of an Ni film formed in vacuum, prior to the formation of an NiSi film as an upper layer of the substrate by subjecting the Ni film to a silicide-annealing treatment.

A second apparatus for vacuum processing used in the formation of a metal film to be converted into a silicide film on the surface of a substrate mainly composed of Si, according to the present invention, comprises a film-forming chamber equipped with an exhaust system; a substrate-supporting stage equipped with a heating means and positioned at the lower portion of the film-forming chamber; a shower plate located above the substrate-supporting stage; a gas-introduction path for the introduction of a reducing gas into the film-forming chamber and a gas-introduction path for the introduction, into the film-forming chamber, a raw gas for forming a metal film consisting of a nickel alkylamidinate gas or a cobalt alkylamidinate gas, these two gas-introduction paths being connected to the film-forming chamber; a canister for accommodating a precursor arranged in the course of the gas-introduction path for the introduction of the metal film-forming raw gas; and a gas-introduction path for the introduction of an inert gas, which is used in gasifying a liquefied precursor through the bubbling thereof and introducing the gasified precursor into the film-forming chamber and which is connected to the canister of the precursor, wherein the film-forming chamber is provided with a gas-supply path for supplying $H_2$ gas for use in a preannealing treatment, which is carried out for the improvement of the quality of a metal film formed in vacuum, prior to the formation of a silicide film as an upper layer of the substrate by subjecting the metal film to a silicide-annealing treatment.

The foregoing second apparatus for vacuum processing is further characterized in that the film-forming chamber is additionally equipped with a heat-treating mechanism for directly converting the preannealed metal film into a silicide film without releasing the vacuum within the chamber.

The foregoing first and second apparatuses for vacuum processing each are further characterized in that the film-forming chamber is further equipped with a heat-treating mechanism for carrying out the preannealing treatment.

The film-forming apparatus according to the present invention comprises a vacuum-processing apparatus or unit for the formation of an Ni film to be converted into a silicide film on the surface of a substrate mainly composed of Si, wherein the vacuum-processing unit comprises a film-forming chamber equipped with an exhaust system, a substrate-supporting stage equipped with a heating means and positioned at the lower portion of the film-forming chamber, a shower plate located above the substrate-supporting stage, a gas-introduction path for the introduction of a reducing gas into the film-forming chamber and a gas-introduction path for the introduction, into the film-forming chamber, a raw gas for forming an Ni film consisting of a nickel alkylamidinate gas, these two gas-introduction paths being connected to the film-forming chamber, a canister for accommodating a precursor arranged in the course of the gas-introduction path for the introduction of the Ni film-forming raw gas, and a gas-introduction path for the introduction of an inert gas, which is used in gasifying a liquefied precursor through the bubbling thereof and introducing the gasified precursor into the film-forming chamber and which is connected to the canister of the precursor; a preannealing chamber comprising a film-forming chamber equipped with an exhaust system, a substrate-supporting stage equipped with a heating means and positioned at the lower portion of the film-forming chamber, a shower plate located above the substrate-supporting stage, and a gas-supply path for supplying, to the film-forming chamber, $H_2$ gas which is used for the preannealing treatment of an Ni film formed in vacuum in the vacuum-processing unit in order to improve the quality of the Ni film; a silicide-annealing chamber for converting, into an NiSi film in vacuo, the Ni film formed in the preannealing chamber in vacuo in order to improve the quality of the Ni film, wherein the silicide-annealing chamber comprises a film-forming chamber equipped with an exhaust system, a substrate-supporting stage equipped with a heating means and positioned at the lower portion of the film-forming chamber; a loading/unloading chamber for the substrate; and a polygonal transporting chamber; the vacuum-processing unit, the preannealing chamber, the silicide-annealing chamber and the loading/unloading chamber being arranged around and connected to the polygonal transporting chamber through respective gate valves and the film-forming apparatus being thus so designed that the substrate transported through the loading/unloading chamber can be, in order, carried in and carried out of the vacuum-processing unit, the preannealing chamber and the silicide-annealing chamber through the transporting chamber to thus treat the substrate sequentially.

Alternatively, the film-forming apparatus according to the present invention comprises a vacuum-processing unit for the formation of a metal film to be converted into a silicide film on the surface of a substrate mainly composed of Si, wherein the vacuum-processing unit comprises a film forming chamber equipped with an exhaust system, a substrate-supporting stage equipped with a heating means and positioned at the lower portion of the film-forming chamber, a shower plate located above the substrate-supporting stage, a gas-introduction path for the introduction of a reducing gas into the film-forming chamber and a gas-introduction path for the introduction, into the film-forming chamber, a raw gas for forming a metal film consisting of a nickel alkylamidinate gas or a cobalt alkylamidinate gas, these two gas-introduction paths being connected to the film-forming chamber, a canister for accommodating a precursor arranged in the course of the gas-introduction path for the introduction of the metal film-forming raw gas, and a gas-introduction path for the introduction of an inert gas, which is used in gasifying a liquefied precursor through the bubbling thereof and introducing the gasified precursor into the film-forming chamber and which is connected to the canister of the precursor; a preannealing chamber comprising a film-forming chamber equipped with an exhaust system, a substrate-supporting stage equipped with a heating means and positioned at the lower portion of the film-forming chamber, a shower plate located above the substrate-supporting stage, and a gas-supply path for supplying, to the film-forming chamber, $H_2$ gas which is used for the preannealing treatment of a metal film formed in vacuum in the vacuum-processing unit in order to improve the quality of the metal film; a silicide-annealing chamber for converting, into a silicide film in vacuo, the metal film formed in the preannealing chamber in vacuo in order to improve the quality of the metal film, wherein the silicide-annealing chamber comprises a film-forming chamber equipped with an exhaust system, a substrate-supporting stage equipped with a heating means and positioned at the lower portion of the film-forming chamber; a loading/unloading chamber for the substrate; and a polygonal transporting chamber; the vacuum-processing unit, the preannealing chamber, the silicide-annealing chamber and the loading/unloading chamber being arranged around and connected to the polygonal transporting chamber through respective gate valves and the film-forming apparatus being thus so designed that the substrate transported from the loading/unloading chamber can be, in order, carried in and carried out of the vacuum-processing unit, the preannealing chamber and the silicide-annealing chamber through the transporting chamber to thus treat the substrate sequentially.

Effects of the Invention

According to the present invention, a metal film is formed by the CVD technique, which is carried out at a temperature as low as possible, the impurities present in the metal film can thus be removed at a low temperature to thus improve the quality of the metal film and subsequently, the metal film is converted into a silicide film. Accordingly, the present invention permits the formation of a desired NiSi film (silicide film) having a low resistance (resistivity). Furthermore, the present invention can be carried out under reaction control conditions and can thus achieve such an effect that excellent coverage characteristics of the resulting film can certainly be ensured. Moreover, according to the present invention, the metal film can be treated according to the through processing technique without releasing the vacuum in the film-forming chamber or without exposing the film to the atmosphere after the formation thereof and this accordingly permits the achievement of the following effects: The evaporation of the impurities can be accelerated and any re-contamination with such impurities, for instance, re-oxidation can be limited to the lowest possible level.

BRIEF DESCRIPTION OF THE DRAWINGS

FIG. 4 shows SEM images illustrating cross sections of substrates after subjecting the same to a silicide-annealing treatment and more specifically.

FIG. 5 shows graphs each showing the results obtained according to the AES analysis of films and more particularly.

FIG. 6 shows SEM images illustrating the cross sections of a substrate, which are observed at the following respective stages, when it is subjected to a silicide-annealing process and arranged in order with the passage of time and more particularly, FIG. 6A is one observed for an as deposited film; FIG. 6B is one observed for the film produced by directly subjecting the as deposited film to a silicide-annealing treatment without subjecting the same to any $H_2$-preannealing treatment; FIG. 6C is one observed for the film produced by directly subjecting the as deposited film immediately after the formation thereof to an $H_2$-preannealing treatment; and FIG. 6D is one observed for the film produced by subjecting the as deposited film immediately after the formation thereof to an H₂-preannealing treatment and then subjecting the preannealed film to a silicide-annealing treatment.

FIG. 7 shows graphs each illustrating the results obtained according to the AES analysis of films, which are associated with the cases as shown in FIG. 6, and more specifically.

FIG. 9 shows SEM images each illustrating the surface of a substrate provided thereon with a film obtained using each of a variety of preannealing gases in Example 1 and more particularly.

FIG. 10 shows SEM images each illustrating the surface and a cross section of a substrate provided thereon with a film and produced in Example 2 and more particularly, FIGS. 10A-1 and 10A-2 are SEM images illustrating the surface and a cross section observed for an as deposited film, respectively; FIGS. 10B-1 and 10B-2 are those illustrating the surface and a cross section observed for the film produced by directly subjecting the as deposited film immediately after the formation thereof to a silicide-annealing treatment, respectively; FIGS. 10C-1 and 10C-2 are those illustrating the surface and a cross section observed for the film produced by subjecting the as deposited film immediately after the formation thereof to an H₂-preannealing treatment, respectively; and FIGS. 10D-1 and 10D-2 are those illustrating the surface and a cross section observed for the film produced by subjecting the as deposited film immediately after the formation thereof to an H₂-preannealing treatment and then subjecting the preannealed film to a silicide-annealing treatment, respectively.

MODE FOR CARRYING OUT THE INVENTION

Figure 1:
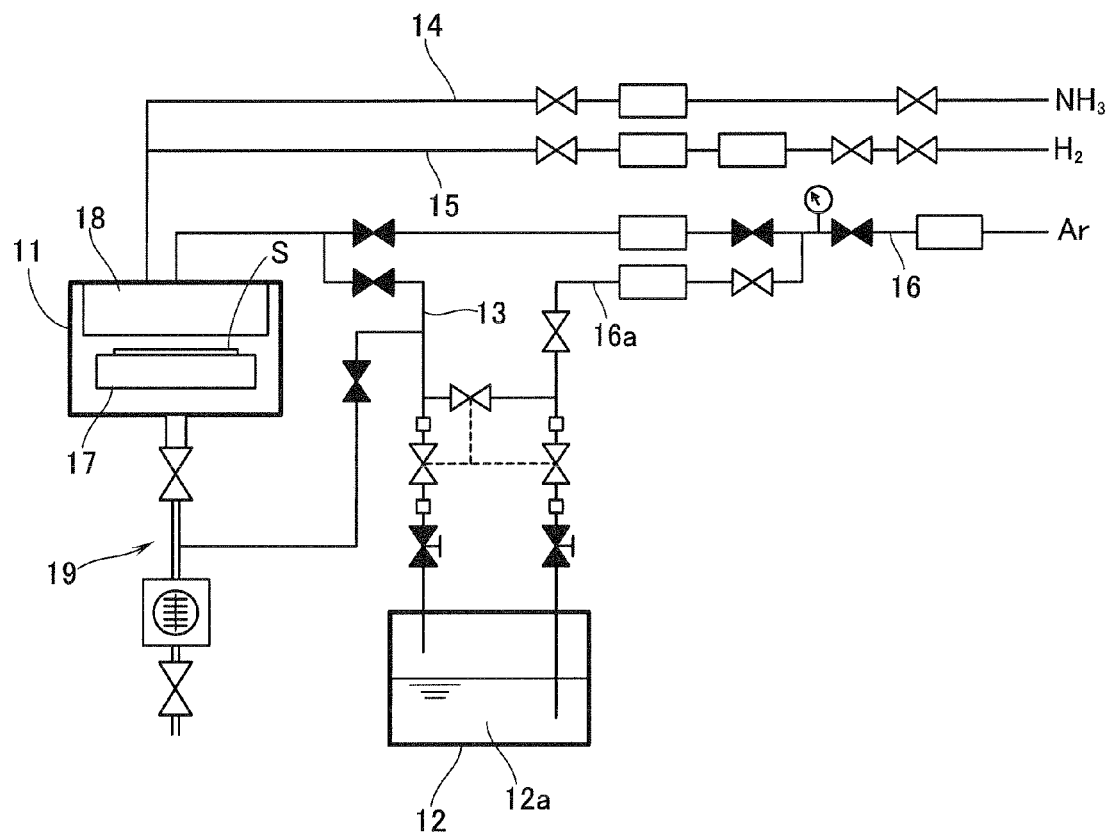
FIG. 1 is a schematic block diagram illustrating an embodiment of the structure of the thermal CVD apparatus used in the present invention.
Figure 2A:
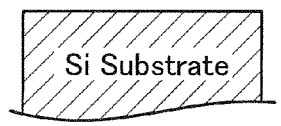
FIG. 2 is a flow diagram for explaining the process for the formation of a silicide film (NiSi film).
Figure 2B:
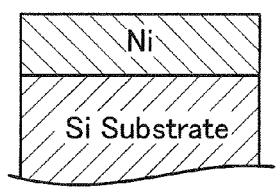
Figure 2C:
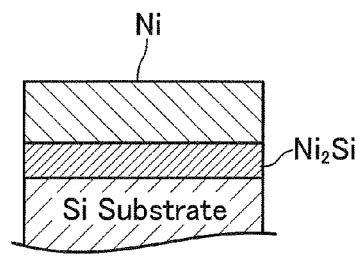
Figure 2D:
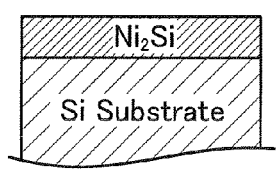
Figure 2E:
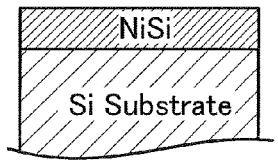

Now, various embodiments of the present invention will first be described below in detail and then the respective elements of the present invention will hereunder be described in more detail with reference to the accompanying drawings.

According to an embodiment of the method for the formation of an NiSi film relating to the present invention, this film-forming method comprises the steps of forming an Ni film on the surface of a substrate mainly composed of Si according to the thermal CVD technique while using a nickel alkylamidinate gas as a raw gas and a mixture of NH₃ and H₂ as a reducing gas and then heat-treating the resulting Ni film to thus form an NiSi film as an upper layer of the surface of the substrate, wherein, prior to the step for heat-treating the Ni film to form the NiSi film, the foregoing Ni film is preannealed at a temperature, which is less than the heat-treating temperature and at which any NiSi film cannot be formed at all, generally ranging from 300 to 400° C. and preferably 300 to 350° C., while using H₂ gas to thus remove the impurities present in the Ni film and thereafter the resulting preannealed Ni film is subjected to a silicide-annealing treatment at a temperature generally ranging from 400 to 500° C. and preferably 400 to 450° C. to thus form a desired NiSi film. In this respect, if the foregoing preannealing treatment is carried out within the apparatus used for the formation of the Ni film, the lower limit of the temperature of the foregoing preannealing treatment may be one which is used for the formation of the Ni film, inasmuch as the use thereof would permit the removal of N, as an impurity, present in the Ni film.

According to an embodiment of the method for the formation of a low resistant silicide film relating to the present invention, this film-forming method comprises the steps of forming an Ni film or a Co film on the surface of a substrate mainly composed of Si according to the thermal CVD technique while using a nickel alkylamidinate gas or a cobalt alkylamidinate gas as a raw gas and a mixture of NH₃ and H₂ as a reducing gas and then heat-treating the resulting Ni or Co film to thus form a low resistant silicide film as an upper layer on the surface of the substrate, wherein, prior to the step for heat-treating the Ni or Co film to form the low resistant silicide film, the foregoing Ni or Co film is preannealed at a temperature which is less than the heat-treating temperature and at which any low resistant silicide film cannot be formed at all, generally ranging from 300 to 400° C. and preferably 300 to 350° C., while using H₂ gas to thus remove the impurities present in the metal film and thereafter the resulting preannealed Ni or Co film is subjected to a silicide-annealing treatment at a temperature generally ranging from 400 to 500° C. and preferably 400 to 450° C. to thus form a desired silicide film.

According to an embodiment of the method for the formation of a metal film used for a silicide annealing treatment relating to the present invention, this metal film-forming method comprises the steps of forming a metal film consisting of an Ni film or a Co film on the surface of a substrate mainly composed of Si according to the thermal CVD technique while using a nickel alkylamidinate or a cobalt alkylamidinate as a metal film-forming precursor and then preannealing the resulting metal film using H₂ gas at a temperature ranging from 300 to 400° C. to thus remove the nitrogen present in the metal film as an impurity derived from the metal film-forming precursor.

According to an embodiment of the apparatus for vacuum processing relating to the present invention, this vacuum processing apparatus is one used for the formation of an Ni film to be converted into a silicide film on the surface of a substrate mainly composed of Si, and the vacuum processing apparatus comprises a film-forming chamber equipped with an exhaust system; a substrate-supporting stage equipped with a heating means and positioned at the lower portion of the film-forming chamber; a shower plate located above the substrate-supporting stage; a gas-introduction path for the introduction of a reducing gas consisting of $NH_3$ and $H_2$ into the film-forming chamber and a gas-introduction path for the introduction, into the film-forming chamber, a raw gas for forming an Ni film consisting of a nickel alkylamidinate gas, these two gas-introduction paths being connected to the film-forming chamber; a canister for accommodating the precursor for forming the Ni film arranged in the course of the gas-introduction path for the introduction of the Ni film-forming raw gas; and a gas-introduction path for the introduction of an inert gas, which is used in gasifying a liquefied precursor through the bubbling thereof and introducing the gasified precursor into the film-forming chamber and which is connected to the canister of the precursor, wherein the film-forming chamber is provided with a gas-supply path for supplying $H_2$ gas used for a preannealing treatment, which is carried out for the improvement of the quality of an Ni film formed in vacuum, prior to the formation of an NiSi film as an upper layer of the substrate by subjecting the Ni film to a silicide-annealing treatment. The film-forming chamber may equip with a heat treating mechanism for converting the preannealed Ni film into the silicide film in vacuo kept and may equip with a heat treating mechanism for carrying out the preannealing treatment.

According to another embodiment of the apparatus for vacuum processing relating to the present invention, this vacuum processing apparatus is one used for the formation of a metal film to be converted into a silicide film on the surface of a substrate mainly composed of Si, and the vacuum processing apparatus comprises a film-forming chamber equipped with an exhaust system; a substrate-supporting stage equipped with a heating means and positioned at the lower portion of the film-forming chamber; a shower plate located above the substrate-supporting stage; a gas-introduction path for the introduction of a reducing gas consisting of $NH_3$ and $H_2$ into the film-forming chamber and a gas-introduction path for the introduction, into the film-forming chamber, a raw gas for forming a metal film consisting of a nickel alkylamidinate gas or a cobalt alkylamidinate gas, these two gas-introduction paths being connected to the film-forming chamber; a canister for accommodating the precursor for forming a metal film arranged in the course of the gas-introduction path for the introduction of the metal film-forming raw gas; and a gas-introduction path for the introduction of an inert gas, which is used in gasifying a liquefied precursor through the bubbling thereof and introducing the gasified precursor into the film-forming chamber and which is connected to the canister of the precursor, wherein the film-forming chamber is provided with a gas-supply path for supplying $H_2$ gas used for a preannealing treatment, which is carried out for the improvement of the quality of a metal film formed in vacuum, prior to the formation of a silicide film as an upper layer of the substrate by subjecting the metal film to a silicide-annealing treatment. The film-forming chamber may equip with a heat treating mechanism for converting the preannealed metal film into the silicide film in vacuo kept and may equip with a heat treating mechanism for carrying out the preannealing treatment.

Next, the thermal CVD film-forming apparatus as an apparatus for vacuum processing according to the present invention will be described below in detail with reference to FIG. 1. As shown in FIG. 1, the vacuum processing apparatus comprises a film-forming chamber 11, and connected to the roof or top portion of the film-forming chamber 11 are a gas-introduction path 13 which is likewise connected to a canister 12 for accommodating a precursor, a gas-introduction path 14 for the introduction of $NH_3$ gas and a gas-introduction path 15 for the introduction of $H_2$ gas, in order to introduce a raw gas (such as a nickel alkylamidinate gas or a cobalt alkylamidinate) and a reducing gas (such as a gas mixture consisting of $NH_3$ and $H_2$) into the film-forming chamber. Each of the gas-introduction paths 14 and 15 is provided with a mass flow controller and a valve in the course thereof so that a predetermined amount of the $NH_3$ or $H_2$ gas can certainly be introduced into the film-forming chamber. A gas-introduction path 16 for the introduction of a carrier gas (such as, for instance, Ar) into the film-forming chamber 11 is also connected to the chamber through the roof thereof. In the film-forming chamber 11, a substrate-supporting stage 17 for mounting or placing a substrate S to be processed is positioned at the lower portion of the film-forming chamber and a shower plate 18 is positioned above the substrate-supporting stage and at the top portion of the chamber. The canister 12 for accommodating a precursor is filled with a liquid precursor 12a for forming a raw gas and more specifically, this raw gas supply system is so designed that a gas such as Ar gas is blown into the liquid precursor through a path 16a branched from the gas-introduction path 16 to thus form a gaseous precursor through the bubbling action thereof and the resulting gaseous precursor can be introduced into the film-forming chamber 11. Each of the gas-introduction path 13, the gas-introduction path 16 and the path 16a is provided with a mass flow controller and a valve in the course thereof so that a predetermined amount of the gaseous precursor or carrier gas can certainly be introduced into the film-forming chamber. Furthermore, the film-forming chamber 11 is also connected to an exhaust pipe 19 in order to control the internal pressure of the film-forming chamber 11 to a predetermined reduced pressure.

The working or performance of the vacuum-processing apparatus, as shown in FIG. 1, is almost identical to that of the conventional thermal CVD apparatus and accordingly, it will simply or briefly be described below. A substrate S to be processed is placed on the substrate-supporting stage 17 within the film-forming chamber 11, a raw gas generated by, for instance, injecting an inert gas into a liquid precursor contained in the canister 12 to thus cause the bubbling of the liquid precursor and reducing gases are introduced into the film-forming chamber 11, through the gas-introduction paths 14 and 15 and the shower plate 18. At this stage, the substrate S positioned within the film-forming chamber 11 is heated to a predetermined temperature level and the pressure in the film-forming chamber 11 is maintained at a desired reduced level. Thus, a film is formed on the surface of the substrate S and accordingly, a metal film is deposited thereon in a desired thickness.

Now, the present invention will hereunder be described in more specifically while taking the following process by way of example: An Ni film is formed according to the thermal CVD technique while using, as an Ni film-forming precursor, nickel alkylamidinate $(N,N'-Ni((tBu)_2-amd)_2$ (this will hereunder be abbreviated as "Ni-Amd") and then the resulting Ni film is subjected to an $H_2$-preannealing treatment and subsequently to a silicide-annealing treatment.

First of all, a method in which a silicide film is formed after the formation of a metal film (an Ni film) on the surface of an Si substrate (wafer) will be described below with reference to FIG. 2.

As shown in FIGS. 2A to 2E, the native oxide film formed on the surface of an Si substrate is first removed according to the usual method (step (a)), an Ni film is formed on the surface of the Si substrate from which the native oxide film has been removed, according to the usual technique such as the CVD or PVD technique under the currently used process conditions (step (b)), the Si substrate provided thereon with the Ni film thus formed is subjected to a first heat-treatment (preannealing treatment) at a desired temperature to thus form an Ni$_2$Si film on the Si substrate (at this stage, un-reacted Ni film still remains on the film) (step (c)), the un-reacted Ni film is removed by the wet etching technique (step (d)), and then the film on the Si substrate is subjected to a second heat-treatment (silicide-annealing treatment) at a desired temperature to thus form a silicide (NiSi) film (step (e)).

The foregoing first heat-treatment or the preannealing treatment is carried out at a low temperature to form a metastable silicide film and thereafter any un-reacted Ni film is removed. In this case, the reason why the first preannealing treatment is carried out at a low temperature is that the diffusion reaction of Si does not make extremely rapid progress. This in turn does not result in the formation of an excess silicide film even in a gate electrode and in the peripheral region thereof in the form of a diffusion layer. In the meantime, the thickness of the foregoing Ni film is not restricted to any particular range, but it is preferred that the thickness thereof is as small as possible from the viewpoint of the production cost. If the Ni film is too thick, a problem arises such that an excess cost is required since the operator should discontinue the silicide-forming reaction in the middle thereof and then remove the unreacted Ni film through etching. In other words, if the Ni film formed has an optimum thickness, a silicide film can be formed, while eliminating the step for removing the unreacted Ni film through etching.

Figure 3:
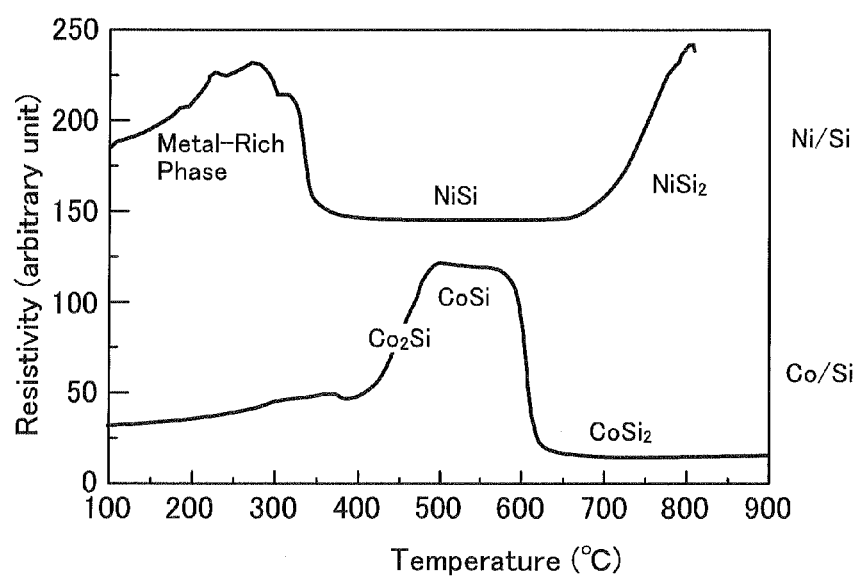
FIG. 3 is a graph showing the relation between the temperature (° C.) and the resistance value (an arbitrary unit) observed for Ni/Si phase or Co/Si phase.

FIG. 3 shows the relation between the temperature (° C.) and resistance value (an arbitrary unit) observed for metal-rich phases or NiSi, NiSi$_2$, Co$_2$Si, CoSi and CoSi$_2$, in the Ni/Si and Co/Si systems. As will be clear from the results plotted on FIG. 3, low resistance values are observed for NiSi and CoSi$_2$ phases.

Then the formation of a film using the foregoing Ni-Amd will hereunder be described in more specifically. A solution of Ni-Amd as an Ni film-forming precursor is charged in a precursor canister heated to and maintained at about 110° C. The raw gas-introduction path and the walls of the film-forming chamber are heated to and maintained at a temperature of not less than 120° C. to inhibit any adsorption of the precursor on the internal surface of the piping and on the inner wall of the film-forming chamber and the temperature of the substrate-supporting stage is maintained at a level of not more than 350° C., for instance, ranging from 200 to 280° C.

Regarding the carrier gas for conveying Ni-Amd to the film-forming chamber, it is sufficient to use an inert gas such as Ar gas and, for instance, such an inert gas is injected into the precursor at a flow rate of about 150 sccm to thus cause bubbling thereof.

If Ni-Amd gas is simply thermally decomposed, the resulting film-forming rate is very low at a temperature of not more than 280° C. and therefore, H$_2$ and NH$_3$ are used as reducing gases. In this respect, it would be sufficient that the total flow rate of the reducing gases is set at a level of not less than 2 times that of the carrier gas and that the ratio: H$_2$/(H$_2$+NH$_3$) is set at a level of not more than 0.9 and it is also acceptable to set the ratio: H$_2$/NH$_3$ at 1:1.

An Ni film is formed under the foregoing conditions.

If an Ni film is subjected to a preannealing treatment (H$_2$-preannealing treatment) after the formation thereof, the film is transported to a chamber through which H$_2$ gas can be passed. The film may be transported in a vacuum or may be transported after once withdrawing it from the chamber and exposing the same to the atmosphere. In this case, the substrate immediately after the completion of the film-forming step may be transported to the subsequent processing chamber, without cooling the same. If the film-forming temperature falls within the range of the preannealing temperature, the preannealing treatment can be carried out without any additional operation, while if it is lower than the preannealing temperature, the preannealing treatment can be carried out after heating the substrate to a desired temperature.

As will be described in the following Examples, it is necessary to use H$_2$ gas as a gas for the foregoing preannealing treatment of the Ni film and any desired object of the present invention cannot be accomplished when using Ar gas and/or NH$_3$ gas as such a preannealing gas.

It has been found that the as deposited film contains about ten and several percentages of N derived from the raw gas and/or the NH$_3$ as a reducing gas, while taking into consideration the results obtained according to the AES analysis shown in FIGS. 5 and 7 and described in detail below. It would thus be recognized that the impurity N present in the as deposited film is removed in the form of NH$_3$ or the like by the H$_2$-preannealing treatment and this in turn permits the improvement of the quality of the resulting film and the formation of an excellent silicide interface.

The heating temperature during the H$_2$-preannealing treatment in general ranges from 300 to 400° C. and preferably 300 to 350° C., and the residence or retention time during the preannealing treatment is about 5 minutes. If the preannealing step is carried out at a temperature falling within the range specified above, desired effects of this preannealing step can be obtained and in particular, the impurity N present in the Ni film can be reduced or completely eliminated. On the other hand, if the preannealing temperature is beyond the range specified above, any desired effect of the preannealing treatment cannot be anticipated.

After the completion of the H$_2$-preannealing treatment, the film is subjected to a silicide-annealing treatment according to the usual method. In this case, the silicide-annealing temperature ranges from 400 to 500° C. and preferably 400 to 450° C. If the silicide-annealing temperature falls within the range specified above, the film undergoes an excellent silicide-forming reaction and in the case of Ni, an excellent NiSi film can certainly be formed.

Figure 4A:
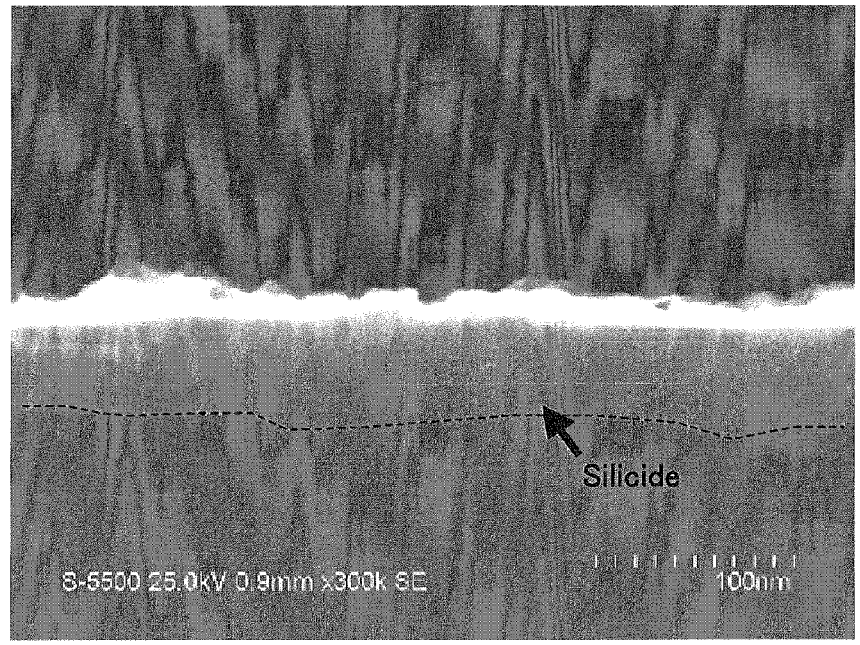
FIG. 4A shows an SEM image illustrating a cross section of the film produced by subjecting a film immediately after the formation thereof (an as deposited film) to an $H_2$-preannealing treatment and then subjecting the preannealed film to a silicide-annealing treatment.
Figure 4B:
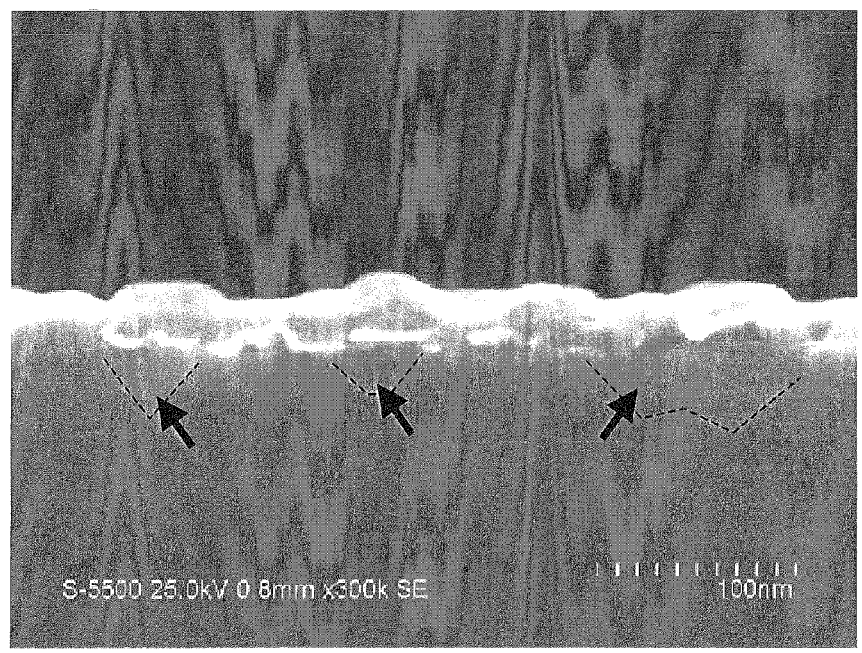
FIG. 4B shows an SEM image illustrating a cross section of the film produced by subjecting the as deposited film to a silicide-annealing treatment without subjecting the same to any $H_2$-preannealing treatment.
Figure 5A:
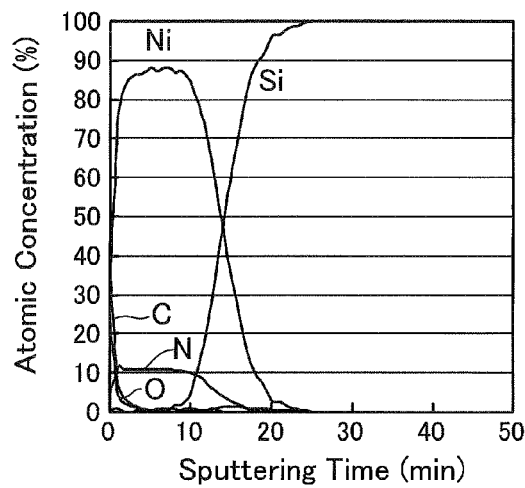
FIG. 5A is a graph illustrating the results obtained according to the AES analysis of a film immediately after the formation thereof (an as deposited film)
Figure 5B:
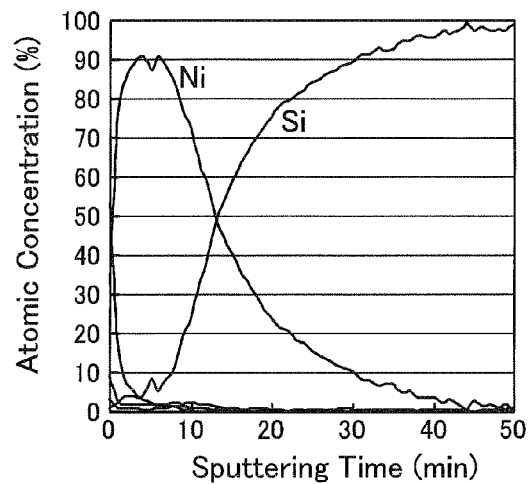
FIG. 5B is a graph illustrating those observed for the film produced by directly subjecting the as deposited film to a silicide-annealing treatment without subjecting the same to any $H_2$-preannealing treatment and FIG. 5C is a graph illustrating those observed for the film produced by subjecting the as deposited film immediately after the formation thereof to an $H_2$-preannealing treatment and then subjecting the preannealed film to a silicide-annealing treatment, which are associated with the cases as shown in FIG. 4.
Figure 5C:
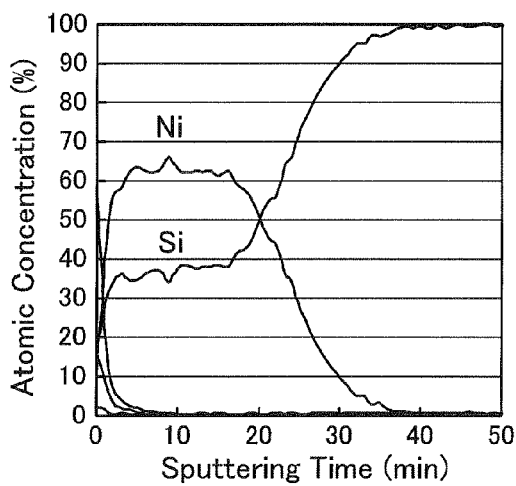

FIG. 4 shows SEM images illustrating cross sections of substrates after subjecting the same to a silicide-annealing treatment and more specifically, FIG. 4A shows an SEM image of the film obtained by subjecting, to an H$_2$-preannealing treatment, a film immediately after the formation thereof according to the CVD technique similar to that used in Example 1 given below (the formation of an as deposited film) and then to a silicide-annealing treatment; and FIG. 4B shows that of the film obtained by directly subjecting the as deposited film to a silicide-annealing treatment without subjecting the same to any H$_2$-preannealing treatment. In addition, FIG. 5 shows graphs each showing the results obtained according to the AES analysis and more particularly, FIG. 5A is a graph illustrating the results observed for the film immediately after the formation thereof (an as deposited film), FIG. 5B is a graph illustrating those observed for the film produced by directly subjecting the as deposited film to a silicide-annealing treatment without subjecting the same to any H$_2$-preannealing treatment and FIG. 5C is a graph illustrating those observed for the film produced by subjecting the as deposited film to an H$_2$-preannealing treatment and then to a silicide-annealing treatment.

As will be seen from FIG. 4A, when forming an as deposited film, then subjecting the as deposited film to an H$_2$-preannealing treatment and then to a silicide-annealing treatment, the silicide-forming reaction takes place on the whole surface of the substrate. In this respect, it can be recognized that an NiSi film is likewise formed while examining the results of the AES analysis as shown in FIG. 5C. In this connection, it would be believed that the impurity N present in the as deposited film (FIG. 5A) is removed by the action of the $H_2$-preannealing treatment (FIG. 5C) and the foregoing results can accordingly be obtained.

On the other hand, as will be clear from FIG. 4B, when forming an as deposited film and directly subjecting the same to a silicide-annealing treatment without carrying out any $H_2$-preannealing treatment, a silicide-forming reaction takes place, but the reaction proceeds in the form of a wedge along the crystal orientation. It would be thought that the wedge-like reaction, which proceeds in the form of a wedge along the crystal orientation, results in the formation of an $NiSi_2$ film having a high resistance. If the formation of this $NiSi_2$ film is completed, it is impossible to convert it into a low resistant NiSi film. As will be clear from the data plotted on FIG. 5B, it would be believed that if the $H_2$-preannealing treatment is omitted, the impurity N still remains in the resulting silicide film and accordingly, the foregoing result is obtained.

Similar to the foregoing case as shown in FIG. 4, shown in FIGS. 6A to 6D are SEM images illustrating the cross sections of a substrate, which are observed, at respective stages, when it is subjected to a silicide-annealing process and arranged in order with the passage of time. More particularly, FIG. 6A is an SEM image observed for an as deposited film produced under the same conditions used in Example 1 as will be described below; FIG. 6B is one observed for the film produced by directly subjecting the as deposited film to a silicide-annealing treatment without subjecting the same to any $H_2$-preannealing treatment; FIG. 6C is one observed for the film produced by directly subjecting the as deposited film immediately after the formation thereof to an $H_2$-preannealing treatment; and FIG. 6D is one observed for the film produced by subjecting the as deposited film immediately after the formation thereof to an $H_2$-preannealing treatment and then subjecting the preannealed film to a silicide-annealing treatment.

Figure 7A:
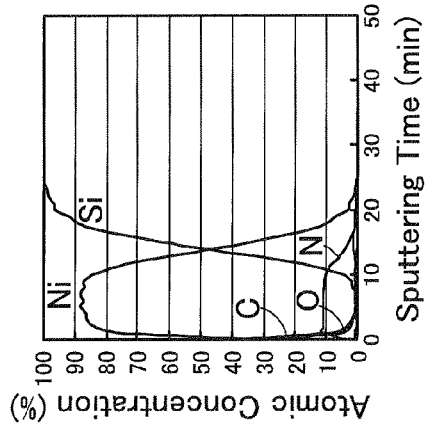
FIG. 7A is a graph illustrating the results obtained according to the AES analysis of an as deposited film.
Figure 7B:
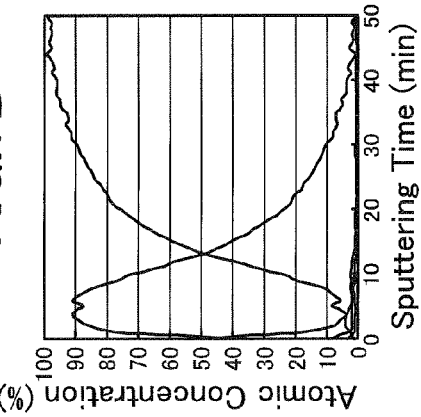
FIG. 7B is a graph illustrating those observed for the film produced by directly subjecting the as deposited film to a silicide-annealing treatment without subjecting the same to any H₂-preannealing treatment.
Figure 7C:
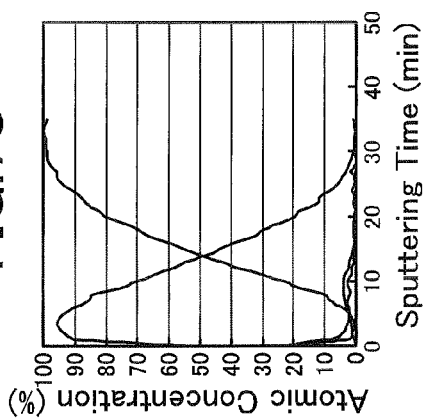
FIG. 7C is a graph illustrating those observed for the film produced by subjecting the as deposited film immediately after the formation thereof to an H₂-preannealing treatment.
Figure 7D:
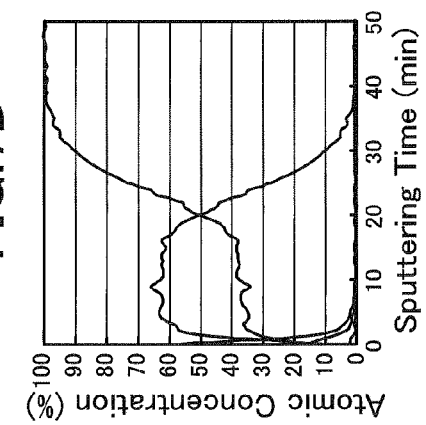
FIG. 7D is a graph illustrating those observed for the film produced by subjecting the as deposited film immediately after the formation thereof to an H₂-preannealing treatment and then subjecting the preannealed film to a silicide-annealing treatment.

Moreover, FIGS. 7A to 7D show graphs each illustrating the results obtained according to the AES analysis of the respective films whose SEM images are taken and shown in the foregoing FIG. 6. More specifically, FIG. 7A is a graph illustrating the results obtained according to the AES analysis of an as deposited film; FIG. 7B is a graph illustrating those observed for the film produced by directly subjecting the as deposited film to a silicide-annealing treatment without subjecting the same to any $H_2$-preannealing treatment; FIG. 7C is a graph illustrating those observed for the film produced by subjecting the as deposited film immediately after the formation thereof to an $H_2$-preannealing treatment; and FIG. 7D is a graph illustrating those observed for the film produced by subjecting the as deposited film immediately after the formation thereof to an $H_2$-preannealing treatment and then subjecting the preannealed film to a silicide-annealing treatment.

The data plotted on FIG. 7C clearly indicate that the $H_2$-preannealing treatment surely permits the removal of impurities, in particular, N present in the as deposited film. The same explanation described above in connection with the foregoing FIGS. 5B and 5C is also true for FIGS. 7B and 7D. In the case as shown in FIG. 7D, the Ni/Si interface is broader than that observed for the as deposited film and this clearly indicates that a desired silicide-forming reaction takes place (in the case of Ni silicide, Ni serves as a diffusible species). Furthermore, it would be recognized from the results of FIG. 6D and FIG. 7D that an NiSi film is certainly formed.

The present invention has been described above while using an Si substrate by way of example, but the substrate is not restricted thereto insofar as it may be a substrate mainly composed of Si and an excellent silicide film can likewise be formed according to the present invention. As such substrate each mainly composed of Si, there may be listed, for instance, an Si substrate, an SiC substrate and an SiGe substrate. In the meantime, the present invention can likewise be applied to, for instance, semiconductor devices each provided thereon with a metal film mainly comprising a metal other than Ni and Co, while taking into consideration the fact that the present invention permits the reduction of impurities present in an as deposited film as a metal film and the acceleration of the reaction of the metal film with the substrate.

Moreover, the present invention has been described above while taking an Ni film by way of example, but the present invention can be applied to Co films. For instance, a Co film produced according to the thermal CVD technique or the like can be subjected to an $H_2$-preannealing treatment to thus remove the impurity N and then to a silicide-annealing treatment to thereby form a low resistant $CoSi_2$ film.

Figure 8:
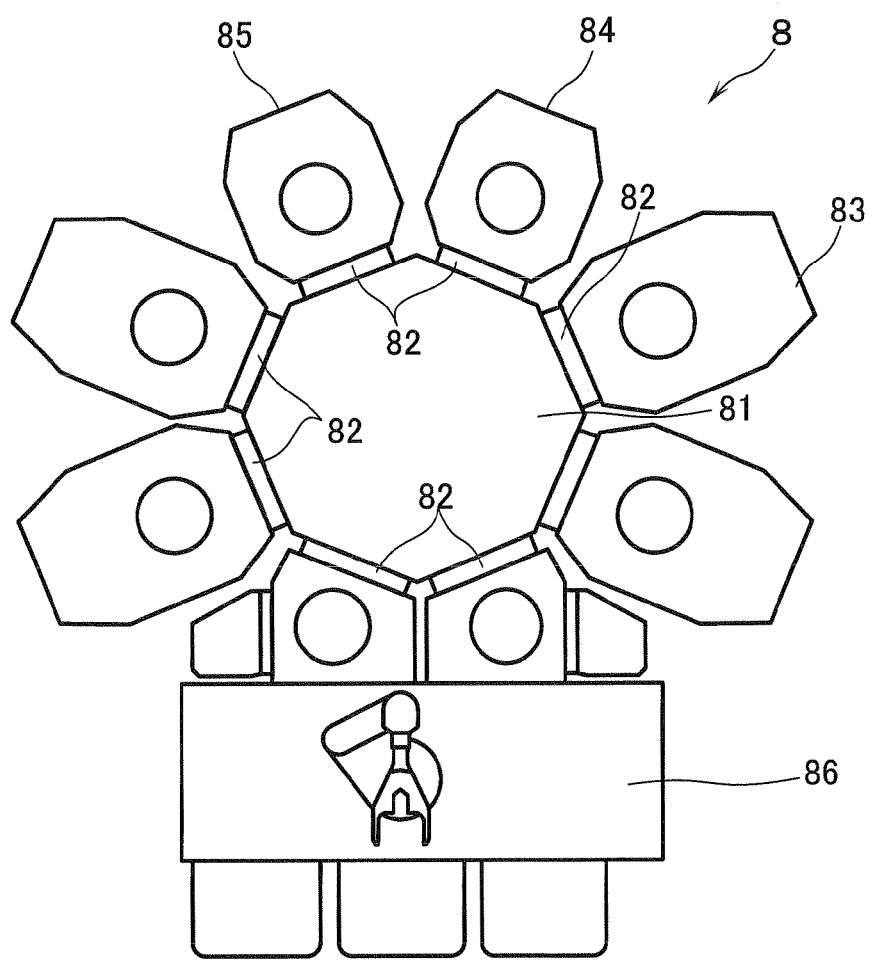
FIG. 8 is a floor plan schematically illustrating an embodiment of the film-forming apparatus according to the present invention.

Next, an embodiment of the film-forming apparatus according to the present invention will hereunder be described in more detail with reference to FIG. 8 attached hereto.

This film-forming apparatus 8 is so designed that it comprises a polygonal transporting chamber 81; a vacuum-processing unit 83, a preannealing chamber 84 and a silicide-annealing chamber 85, each of which is connected to each corresponding side of the polygonal transporting chamber through a gate valve 82; a loading/unloading chamber 86 likewise connected to the transporting chamber 81 through a gate valve 82; and a transporting robot which is so designed that a substrate can be, in order, carried in and carried out of the vacuum-processing unit 83, the preannealing chamber 84 and the silicide-annealing chamber 85 through the transporting chamber 81 to thus treat the substrate sequentially. Further, it is a matter of course that each of the transporting chamber, and a substrate-processing unit or a substrate-processing chamber, the loading/unloading chamber or the like positioned around the transporting chamber may be connected to an exhaust system, or all of them can comprehensively be controlled by a single exhaust system.

The foregoing vacuum processing unit 83 is one used in the formation of a metal film to be converted into a silicide film on the surface of a substrate mainly composed of Si, and the unit comprises a film-forming chamber equipped with an exhaust system; a substrate-supporting stage equipped with a heating means and positioned at the lower portion of the film-forming chamber; a shower plate located above the substrate-supporting stage; a gas-introduction path for the introduction of a reducing gas into the film-forming chamber and a gas-introduction path for the introduction, into the film-forming chamber, a raw gas for forming a metal film consisting of a nickel alkylamidinate gas or a cobalt alkylamidinate gas, these two gas-introduction paths being connected to the film-forming chamber; a canister for accommodating a precursor arranged in the course of the gas-introduction path for the introduction of the metal film-forming raw gas; and a gas-introduction path for the introduction of an inert gas, which is used in gasifying a liquefied precursor through the bubbling of the liquid precursor and introducing the gasified precursor into the film-forming chamber and which is connected to the canister of the precursor.

The foregoing preannealing chamber 84 comprises a film-forming chamber equipped with an exhaust system; a substrate-supporting stage equipped with a heating means and positioned at the lower portion of the film-forming chamber; and a shower plate located above the substrate-supporting stage, wherein the film-forming chamber is provided with a gas-supply path for supplying $H_2$ gas used for a preannealing treatment, which is carried out for the improvement of the quality of the resulting metal film formed in the vacuum-processing unit in vacuum.

The foregoing silicide-annealing chamber 85 is one for converting, into a silicide film in vacuum, the metal film which has been subjected to a preannealing treatment in the preannealing chamber in order to improve the quality of the metal film formed in vacuo, and the silicide-annealing chamber comprises a film-forming chamber equipped with an exhaust system; a substrate-supporting stage equipped with a heating means and positioned at the lower portion of the film-forming chamber.

This film-forming apparatus may likewise be so designed that when forming a silicide film according to the foregoing method and then further forming another film, if desired, on the silicide film or optionally subjecting the latter to other treatment, one or a plurality of units for carrying out such a film-forming step or other treating steps are arranged around the transporting chamber 81 through respective gate valves 82, while the substrate is carried in and/or carried out of each unit or chamber by the action of a transporting robot to thus carry out the respective treatments.

Example 1

In this Example, Ni films were formed according to the thermal CVD technique, then preannealed under the same conditions while using, as a preannealing gas species, $H_2$ gas, and a mixture of Ar gas and $NH_3$ gas and thereafter the preannealed Ni films each were subjected to a silicide-annealing treatment.

The formation of an Ni film according to the thermal CVD technique was carried out using Ni-Amd gas as a raw gas and $NH_3$ gas and $H_2$ gas as reducing gases under the following process conditions: The temperature of the shower plate: 150° C.; the temperature of the precursor canister: 130° C.; the temperature of the substrate-supporting stage: 240° C.; the flow rate of the carrier gas (Ar): 150 sccm; the flow rate of the $NH_3$ gas: 150 sccm; the flow rate of the $H_2$ gas: 150 sccm; and the film-forming pressure: 390 Pa. Moreover, the preannealing treatments using $H_2$ gas, Ar gas and $NH_3$ gas each were carried out at 350° C. for 300 seconds and the silicide-annealing treatment was carried out at 400° C.

Figure 9A:
FIG. 9A is an SEM image observed for an as deposited film.
Figure 9B:
FIG. 9B is one observed for the film produced by directly subjecting the as deposited film to a silicide-annealing treatment.
Figure 9C:
FIG. 9C is one observed for the film produced by subjecting the as deposited film immediately after the formation thereof to an H₂-preannealing treatment.
Figure 9D:
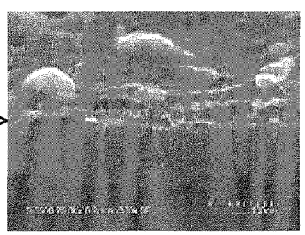
FIG. 9D is one observed for the film produced by subjecting the as deposited film immediately after the formation thereof to an H₂-preannealing treatment and then subjecting the preannealed film to a silicide-annealing treatment.
Figure 9E:
FIG. 9E is one observed for the film produced by subjecting the as deposited film immediately after the formation thereof to an Ar-preannealing treatment.
Figure 9F:
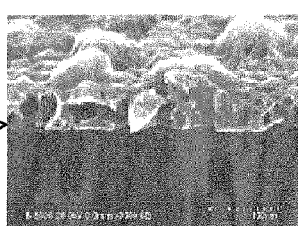
FIG. 9F is one observed for the film produced by subjecting the as deposited film immediately after the formation thereof to an Ar-preannealing treatment and then subjecting the preannealed film to a silicide-annealing treatment.
Figure 9G:
FIG. 9G is one observed for the film produced by subjecting the as deposited film immediately after the formation thereof to an NH₃-preannealing treatment.
Figure 9H:
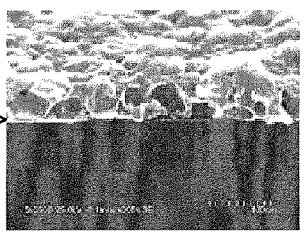
FIG. 9H is one observed for the film produced by subjecting the as deposited film immediately after the formation thereof to an NH₃-preannealing treatment and then subjecting the preannealed film to a silicide-annealing treatment.

The SEM micrographs (images) of the surface of the substrate observed for respective steps are shown in FIGS. 9A to 9H, respectively. More specifically, FIG. 9A is an SEM image observed for an as deposited film; FIG. 9B is one observed for the film produced by directly subjecting the as deposited film to a silicide-annealing treatment without subjecting the same to any preannealing treatment; FIG. 9C is one observed for the film produced by subjecting the as deposited film after the formation thereof to an $H_2$-preannealing treatment; FIG. 9D is one observed for the film produced by subjecting the as deposited film after the formation thereof to an $H_2$-preannealing treatment and then to a silicide-annealing treatment; FIG. 9E is one observed for the film produced by subjecting the as deposited film after the formation thereof to an Ar-preannealing treatment; FIG. 9F is one observed for the film produced by subjecting the as deposited film after the formation thereof to an Ar-preannealing treatment and then to a silicide-annealing treatment; FIG. 9G is one observed for the film produced by subjecting the as deposited film after the formation thereof to an $NH_3$-preannealing treatment; and FIG. 9H is one observed for the film produced by subjecting the as deposited film after the formation thereof to an $NH_3$-preannealing treatment and then to a silicide-annealing treatment.

As seen from the results as shown in FIGS. 9A to 9H, the occurrence of the silicide-forming reaction, in which the desired NiSi film is formed, is confirmed only when subjecting the Ni film to a preannealing treatment with $H_2$ gas and any desired silicide film could not be formed at all when carrying out the preannealing treatment while using Ar gas and $NH_3$ gas.

In consideration of the results obtained according to the AES analysis as shown in FIGS. 5 and 7, it would be believed that the impurity N incorporated into the Ni film in its as deposited state and derived from the raw gas and $NH_3$ gas as a reducing gas is removed in the form of $NH_3$ or the like by the action of the $H_2$-preannealing treatment so that the quality of the Ni film is improved and an excellent low resistant silicide (NiSi) interface is thus formed. On the other hand, the both of Ar gas and $NH_3$ gas do not show such effects of eliminating the impurities and of improving the quality of the Ni film.

Example 2

In this Example, films each were formed on the surface of a substrate, according to the following procedures, while using Ni-Amd gas as a raw gas and $H_2$ gas and $NH_3$ gas as reducing gases: (1) An Ni film was formed on the surface of an Si substrate according to the thermal CVD technique (an as deposited film); (2) a film was produced by directly subjecting the resulting as deposited film immediately after the formation thereof to a silicide-annealing treatment without subjecting the same to any $H_2$-reannealing treatment; (3) a film was produced by subjecting the as deposited film only to an $H_2$-preannealing treatment; and (4) a film was produced by subjecting the as deposited film to an $H_2$-preannealing treatment and then to a silicide-annealing treatment. Regarding each film thus formed on the substrate, the cross section and the surface thereof were examined by taking SEM micrographs (images) and further the resistance of each film was determined.

The formation of these Ni films according to the thermal CVD technique were carried out while using the following process conditions: The temperature of the shower plate: 150° C.; the temperature of the precursor canister: 130° C.; the temperature of the substrate-supporting stage: 200° C.; the flow rate of the carrier gas (Ar): 150 sccm; the flow rate of the $NH_3$ gas: 150 sccm; the flow rate of the $H_2$ gas: 150 sccm; and the film-forming pressure: 390 Pa. Moreover, the $H_2$-preannealing treatment was carried out at 350° C. for 300 seconds and the silicide-annealing treatment was carried out at 400° C.

The resulting SEM images are shown in FIGS. 10A-1 to 10D-2. More particularly, FIGS. 10A-1 and 10A-2 are SEM images illustrating a cross section and the surface observed for the as deposited film, respectively and the resistivity of the film was found to be 39Ω/☐ (ohm/sq). FIGS. 10B-1 and 10B-2 are those illustrating a cross section and the surface observed for the silicide film produced by directly subjecting the as deposited film immediately after the formation thereof to a silicide-annealing treatment, respectively and the resistivity of the film was found to be 10.9Ω/☐ (ohm/sq). FIGS. 10C-1 and 10C-2 are those illustrating a cross section and the surface observed for the film produced by subjecting the as deposited film immediately after the formation thereof to only an $H_2$-preannealing treatment, respectively and the resistivity of the film was found to be 8.8Ω/☐ (ohm/sq). FIGS. 10D-1 and 10D-2 are those illustrating a cross section and the surface observed for the silicide film produced by subjecting the as deposited film to an $H_2$-preannealing treatment and then to a silicide-annealing treatment, respectively and the resistivity of the film was found to be 3.1Ω/☐ (ohm/sq).

As has been described above, it was found that the silicide film produced according to the method of the present invention has the lowest resistivity (see, FIGS. 10D-1 and 10D-2). The data shown in FIGS. 10D-1 and 10D-2 clearly indicate that the method according to the present invention permits the complete conversion of the Ni film formed on the substrate into a silicide (NiSi).

INDUSTRIAL APPLICABILITY

The present invention can provide a low resistant silicide film and therefore, the present invention can widely be used in such technical fields as the semiconductor device manufacturing field in which silicide films are used.

DESCRIPTION OF SYMBOLS

8: Film-forming Apparatus; 11: Film-forming Chamber; 12: Precursor Canister; 12a: Liquid Precursor; 13, 14, 15, 16: Gas-introduction Paths; 16a: Path; 17: Substrate-supporting Stage; 18: Shower Plate; 19: Exhaust System; 81: Transporting Chamber; 82: Gate Valve; 83: Vacuum-processing Apparatus (Unit); 84: Preannealing Chamber; 85: Silicide-annealing Chamber; 86: Loading/Un-loading Chamber; S: Substrate.

What is claimed is:

1. An apparatus for vacuum processing for use in forming an Ni film to be converted into a silicide film on the surface of a substrate mainly composed of Si, which comprises
    a film-forming chamber equipped with an exhaust system;
    a substrate-supporting stage equipped with a heating means and positioned at the lower portion of the film-forming chamber;
    a shower plate located above the substrate-supporting stage;
    a gas-introduction path for introducing a reducing gas into the film-forming chamber and a gas-introduction path for introducing, into the film-forming chamber, a raw gas for forming an Ni film consisting of a nickel alkylamidinate gas, these two gas-introduction paths being connected to the film-forming chamber directly;
    a canister for accommodating a precursor arranged in the course of the gas-introduction path for the introduction of the Ni film-forming raw gas; and
    a gas-introduction path for introducing an inert gas, which is connected to the canister for gasifying a liquefied precursor through the bubbling thereof and introducing the gasified precursor into the film-forming chamber and which is directly connected to the film-forming chamber,
    wherein the film-forming chamber is directly provided with a gas-supply path for supplying $H_2$ gas used for a preannealing treatment of an Ni film formed in vacuum, which is carried out for the removal of an impurity present in the Ni film and originated from the raw gas for forming the Ni film and thus improving the quality of the Ni film, prior to forming an NiSi film as an upper layer of the substrate by subjecting the Ni film to a silicide-annealing treatment.

2. An apparatus for vacuum processing for use in forming a metal film to be converted into a silicide film on the surface of a substrate mainly composed of Si, which comprises
    a film-forming chamber equipped with an exhaust system;
    a substrate-supporting stage equipped with a heating means and positioned at the lower portion of the film-forming chamber;
    a shower plate located above the substrate-supporting stage;
    a gas-introduction path for introducing a reducing gas into the film-forming chamber and a gas-introduction path for introducing, into the film-forming chamber, a raw gas for forming a metal film consisting of a nickel alkylamidinate gas or a cobalt alkylamidinate gas, these two gas-introduction paths being connected to the film-forming chamber directly;
    a canister for accommodating a precursor arranged in the course of the gas-introduction path for the introduction of the metal film-forming raw gas; and
    a gas-introduction path for introducing an inert gas, which is connected to the canister for gasifying a liquefied precursor through the bubbling thereof and introducing the gasified precursor into the film-forming chamber and which is directly connected to the film-forming chamber,
    wherein the film-forming chamber is directly provided with a gas-supply path for supplying $H_2$ gas used in a preannealing treatment of a metal film formed in vacuum, which is carried out for the removal of impurities present in the metal film and originated from the raw gas for forming the metal film and thus improving the quality of the metal film, prior to forming a silicide film as an upper layer of the substrate by subjecting the metal film to a silicide-annealing treatment.

3. The apparatus for vacuum processing as set forth in claim 2, wherein the film-forming chamber is further equipped with a heat-treating mechanism for directly and continuously converting the preannealed metal film into the silicide film without releasing the vacuum in the film-forming chamber.

4. The apparatus for vacuum processing as set forth in claim 2, wherein the film-forming chamber is further equipped with a heat-treating mechanism for carrying out a preannealing treatment.

5. The apparatus for vacuum processing as set forth in claim 3, wherein the film-forming chamber is further equipped with a heat-treating mechanism for carrying out a preannealing treatment.

6. A film-forming apparatus characterized in that the apparatus comprises a vacuum-processing unit for forming an Ni film to be converted into a silicide film on the surface of a substrate mainly composed of Si, which comprises a film-forming chamber equipped with an exhaust system, a substrate-supporting stage equipped with a heating means and positioned at the lower portion of the film-forming-chamber, a shower plate located above the substrate-supporting stage, a gas-introduction path for introducing a reducing gas into the film-forming chamber and a gas-introduction path for introducing, into the film-forming chamber, a raw gas for forming an Ni film consisting of a nickel alkylamidinate gas, these two gas-introduction paths being connected to the film-forming chamber directly, a canister for accommodating a precursor arranged in the course of the gas-introduction path for the introduction of the Ni film-forming raw gas, and a gas-introduction path for introducing an inert gas, which is connected to the canister for gasifying a liquefied precursor through the bubbling thereof and introducing the gasified precursor into the film-forming chamber and which is directly connected to the film-forming chamber, a preannealing chamber comprising a film-forming chanter equipped with an exhaust system, a substrate-supporting stage equipped with a heating means and positioned at the lower portion of the film-forming chamber, a shower plate located above the substrate-supporting stage, and a gas-supply path for supplying, to the film-forming chamber, $H_2$ gas which is used for a preannealing treatment of an Ni film formed in vacuum in the vacuum-processing unit in order to remove impurities present in the Ni film and originated from the raw gas for forming the Ni film and thus improving the quality of the Ni film; a silicide-annealing chamber for converting, into an NiSi film in vacuum, the Ni film formed in the preannealing chamber in vacuum in order to improve the quality of the Ni film, wherein the silicide-annealing chamber comprises a film-forming chamber equipped with an exhaust system and a substrate-supporting stage equipped with a heating means and positioned at the lower portion of the film-forming chamber; a loading/unloading chamber for the substrate; and a polygonal transporting chamber, the vacuum-processing unit, the preannealing chamber, the silicide annealing chamber and the loading/unloading chamber being arranged around and connected to the polygonal transporting chamber through respective gate valves and the film-forming apparatus being thus so designed that the substrate transported through the loading/unloading chamber can be, in order, carried in and carried out of the vacuum-processing unit, the preannealing chamber and the silicide-annealing chamber through the transporting chamber to thus treat the substrate sequentially.

7. A film-forming apparatus characterized that the apparatus comprises a vacuum-processing unit for forming a metal film to be converted into a silicide film on the surface of a substrate mainly composed of Si, wherein the vacuum-processing unit comprises a film-forming chamber equipped with an exhaust system, a substrate-supporting stage equipped with a heating means and positioned at the lower portion of the film-forming chamber, a shower plate located above the substrate-supporting stage, a gas-introduction path for introducing a reducing gas into the film-forming chamber and a gas-introduction path for introducing, into the film-forming chamber, a raw gas for forming a metal film consisting of a nickel alkylamidinate gas or a cobalt alkylamidinate gas, these two gas-introduction paths being connected to the film-forming chamber directly, a canister for accommodating a precursor arranged in the course of the gas-introduction path for the introduction of the metal film-forming raw gas, and a gas-introduction path for introducing an inert gas, which is connected to the canister for gasifying a liquefied precursor through the bubbling thereof and introducing the gasified precursor into the film-forming chamber and which is directly connected to the film-forming chamber; a preannealing chamber comprising a film-forming chamber equipped with an exhaust system, a substrate-supporting stage equipped with a heating means and positioned at the lower portion of the film-forming chamber, a shower plate located above the substrate-supporting stage, and a gas-supply path for supplying, to the film-forming chamber, $H_2$ gas which is used for a preannealing treatment of a metal film formed in vacuum in the vacuum-processing unit in order to remove impurities present in the metal film and originated from the raw gas for forming the metal film and thus improving the quality of the metal film; a silicide-annealing chamber for converting, into a silicide film in vacuum, the metal film formed in the preannealing chamber in vacuum in order to improve the quality of the metal film, wherein the silicide-annealing chamber comprises a film-forming chamber equipped with an exhaust system and a substrate-supporting stage equipped with a heating means and positioned at the lower portion of the film-forming chamber; a loading/unloading chamber for the substrate; and a polygonal transporting chamber, the vacuum-processing unit, the preannealing chamber, the silicide-annealing chamber and the loading/unloading chamber being arranged around and connected to the polygonal transporting chamber through respective gate valves and the film-forming apparatus being thus so designed that the substrate transported through the loading/unloading chamber can be, in order, carried in and carried out of the vacuum-processing unit, the preannealing chamber and the silicide-annealing chamber through the transporting chamber to thus treat the substrate sequentially.

* * * * *